US008193616B2

(12) United States Patent
Hamaguchi et al.

(10) Patent No.: US 8,193,616 B2
(45) Date of Patent: Jun. 5, 2012

(54) SEMICONDUCTOR DEVICE ON DIRECT SILICON BONDED SUBSTRATE WITH DIFFERENT LAYER THICKNESS

(75) Inventors: Masafumi Hamaguchi, White Plains, NY (US); Ryoji Hasumi, Crompond, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 249 days.

(21) Appl. No.: 12/493,469

(22) Filed: Jun. 29, 2009

(65) Prior Publication Data

US 2010/0327395 A1 Dec. 30, 2010

(51) Int. Cl.
*H01L 29/04* (2006.01)

(52) U.S. Cl. . 257/627; 257/392; 257/500; 257/E21.088; 257/E29.003

(58) Field of Classification Search ................ 257/369, 257/392, 402, 500, 501, 627, E29.003, E21.088, 257/365; 438/455
See application file for complete search history.

(56) References Cited

U.S. PATENT DOCUMENTS

| | | | | | |
|---|---|---|---|---|---|
| 5,821,769 | A | * | 10/1998 | Douseki | 326/34 |
| 5,940,691 | A | * | 8/1999 | Manning | 438/151 |
| 6,448,114 | B1 | * | 9/2002 | An et al. | 438/142 |
| 6,818,496 | B2 | * | 11/2004 | Dennison et al. | 438/239 |
| 7,060,585 | B1 | * | 6/2006 | Cohen et al. | 438/355 |
| 7,087,967 | B2 | * | 8/2006 | Mori et al. | 257/348 |
| 2005/0266644 | A1 | * | 12/2005 | Matsumoto | 438/275 |
| 2006/0091427 | A1 | * | 5/2006 | Waite et al. | 257/213 |
| 2007/0187797 | A1 | * | 8/2007 | Kato et al. | 257/500 |
| 2007/0257313 | A1 | * | 11/2007 | Hidaka et al. | 257/347 |
| 2009/0042379 | A1 | * | 2/2009 | Chen et al. | 438/591 |
| 2009/0108301 | A1 | * | 4/2009 | Yin et al. | 257/255 |
| 2009/0173967 | A1 | | 7/2009 | Hamaguchi et al. | |
| 2010/0044758 | A1 | * | 2/2010 | Cohen et al. | 257/255 |
| 2010/0203708 | A1 | * | 8/2010 | Fogel et al. | 438/473 |

OTHER PUBLICATIONS

James Wood, "Toshiba achieves higher hole mobility for future generation CMOS technology", Jun. 20, 2008, pp. 1-2, http://news.soft32.com/toshiba-achieves-higher-hole-mobility-for-future-generation-cmos-technology_6630.html.*
Hamaguchi et al, Higher Hole Mobility Induced by Twisted Direct Silicon Bonding (DSB), VLSI Tech. Dig. p. 178 (2008).
M. Hamaguchi, et al.; Higher Hole Mobility Induced by Twisted Direct Silicon Bonding (DSB), 2008 Symposium on VLSI Technology Digest of Technical Papers, pp. 178-179.
Haizhou Yin, et al.; Scalability of Direct Silicon Bonded (DSB) Technology for 32nm Node and Beyond, 2007 Symposium on VLSI Technology Digest of Technical Papers, pp. 222-223.

* cited by examiner

*Primary Examiner* — Matthew Landau
*Assistant Examiner* — Joseph C Nicely
(74) *Attorney, Agent, or Firm* — Turocy & Watson, LLP (57) ABSTRACT

A Direct Silicon Bonded substrate can include a first substrate and a second substrate in which the second substrate can be rotated to an azimuthal twist angle of 45 degrees in comparison to the first substrate. Disclosed are a semiconductor device and a method for making a semiconductor device that includes a DSB substrate with an adjusted thickness based upon the threshold voltage (Vt). In other words, a thicker substrate or layer can correspond to a high threshold voltage (HVt) and a thinner substrate or layer can correspond to a low threshold voltage (LVt) in order to improve mobility in LVt devices.

3 Claims, 7 Drawing Sheets

SEMICONDUCTOR DEVICE ON DIRECT SILICON BONDED SUBSTRATE WITH DIFFERENT LAYER THICKNESS

TECHNICAL FIELD

The present invention relates to a semiconductor device on Direct Silicon Bonded (DSB) substrate in which layer thickness is adjusted based on an amount of threshold voltage (Vt).

BACKGROUND

A semiconductor device using a direct bond substrate, for example, a substrate having a direct silicon bond (DSB) has a structure in which hybrid-orientation-technology can be used and which does not have a silicon-on-insulator (SOI) structure. The DSB substrate does not have buried oxide (BOX) unlike the SOI substrate. Therefore, ideally, nothing other than silicon is provided on an interface on which silicon layers having different plane orientations (crystal orientations) are bonded together.

Direct Silicon Bonded (DSB) is a bulk CMOS hybrid orientation technology that can exploit the higher electron and hole mobility expected from Silicon surfaces. Regarding hybrid orientation fabrication and technology, a twist-angle-optimized direct silicon bonded substrate can be formed. The bonding process can include the bonding of two semiconductor layers that have different surface orientations at an optimal azimuthal twist angle. The azimuthal twist angle can be the angle formed between notches made in a semiconductor wafer corresponding to a crystalline direction. The azimuthal twist angle is the angle between the notches or respective crystalline directions when the wafers are direct Silicon bonded to one another.

With a selected twist angle of 45 degrees between the crystalline layers, an improvement in the morphology of the defective boundary regions can be achieved. DSB in combination with the twist angle of 45 degrees can enable a PFET to have higher mobility compared to conventional substrates without degrading electron mobility for an NFET. Additionally, two layers that are Direct Silicon Bonded together with a 45 degree twist angle an show higher hole mobility in comparison to a DSB substrate with zero degree twist angle. Yet, the bonded interface between the two layers that are DSB together can cause high junction leakage current.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Rather, the sole purpose of this summary is to present some concepts of the invention in a simplified form as a prelude to the more detailed description that is presented hereinafter.

One aspect of the subject innovation relates to a Direct Silicon Bonded (DSB) substrate with two or more layers (e.g., substrates), wherein a thickness related to at least one layer is adjusted and formed based upon an amount of threshold voltage (Vt). A high threshold voltage (HVt) can correspond to a greater thickness of a substrate in comparison to a low threshold voltage (LVt). Thus, a HVt substrate can have a greater thickness than a LVt substrate in order to improve hole mobility and mitigate junction leakage.

Another aspect of the subject innovation relates to methods of making a semiconductor device with defined thickenss for a substrate within the DSB substrate such that a greater Vt (e.g., HVt, etc.) corresponds to a larger thickness and a lesser Vt (e.g., LVt, etc.) corresponds to a less thickness. In general, a HVt substrate or region can be formed with a thickness that is greater than a thickness related to a LVt substrate or region.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

The following is a description of embodiments of the subject innovation, with reference to the accompanying drawings. The accompanying drawings are schematic views designed to facilitate explanation and understanding of the innovation. The shapes, sizes, and ratios shown in the drawings might be different from those of the actual devices, but they may be arbitrarily changed or modified, with the following description and the conventional techniques being taken into account.

The subject innovation mitigates high junction leakage while gaining improved hole mobility in a Direct Silicon Bonded (DSB) substrate. Typically, a DSB substrate can include at least two layers that are directly bonded together in which one layer can be twisted to an azimuthal twist angle of 45 degrees. With the twist angle of 45 degrees, higher hole mobility is reflected—yet high junction leakage exists at the bonded interface. The subject innovation mitigates such high junction leakage by varying DSB layer thickness based upon threshold voltage (Vt) levels. For example, a high threshold voltage (HVt) can be a first thickness and a low threshold voltage (LVt) can be a second thickness in which the first thickness is greater than the second thickness. In other words, the thickness of a DSB layer can be created/adjusted based upon the amount of the threshold voltage (Vt). Thus, the larger the threshold voltage, the thicker the DSB layer can be and the smaller the threshold voltage, the DSB layer can be thinner.

Figure 1:
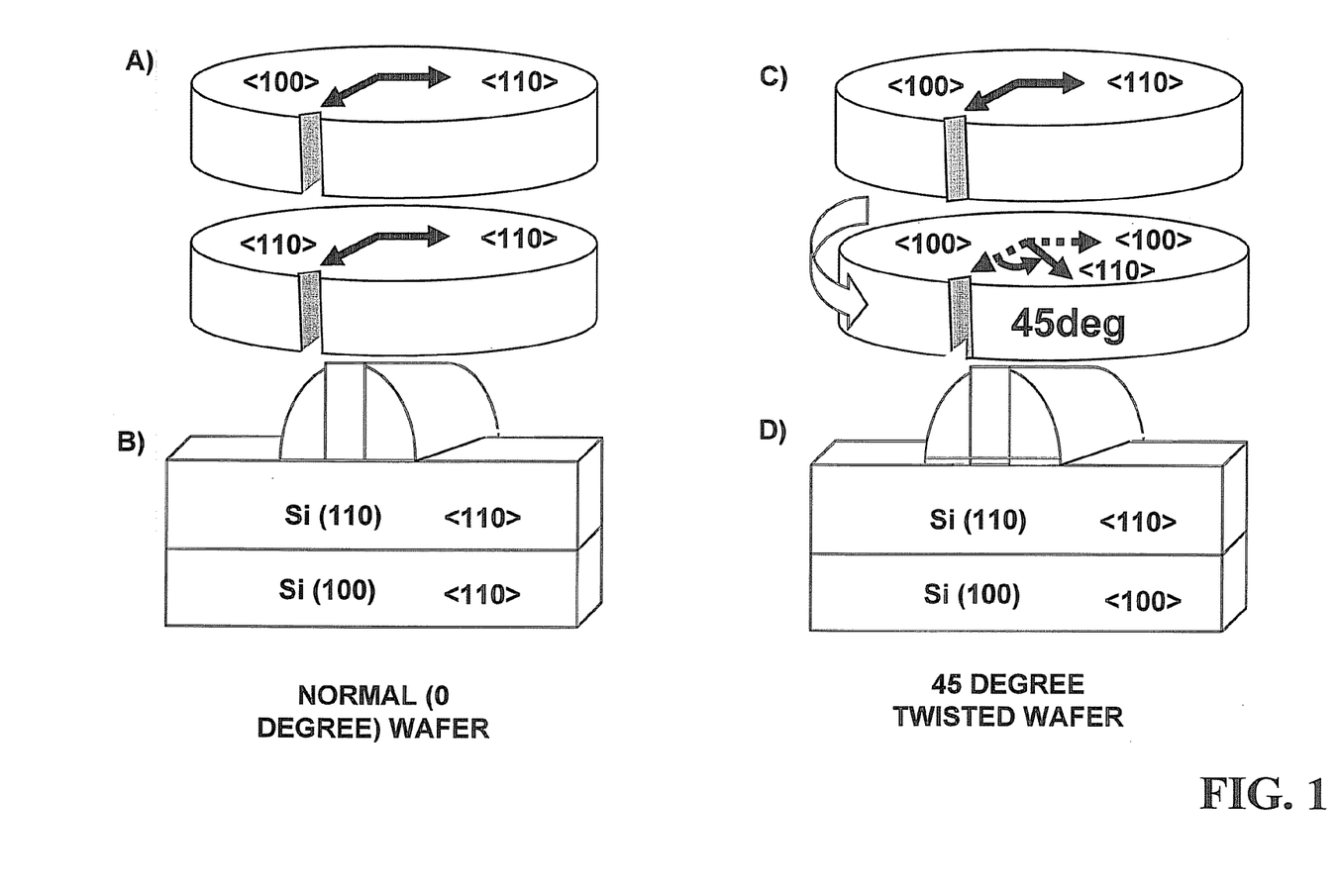
FIG. 1 is a cross-sectional view of a bulk Silicon zero degree wafer and a bulk Silicon 45 degree twisted wafer.

Now turning to the Figures, FIG. 1 illustrates a cross-sectional view of a bulk Silicon zero degree wafer and a bulk Silicon 45 degree twisted wafer. The cross-sectional view can include a DSB with a zero degree twist base wafer shown at A and B. FIG. 1 further shows C and D with a schematic of DSB with 45 deg twisted (100) base wafer. The crystal direction along the channel direction can be different between (110) and (100) for such wafer, <110> for PFET but <100> for NFET (FIG. 1(D)). By incorporating a 45 degree twist angel to the DSB bulk wafer, higher hole mobility can be achieved. However, the DSB bulk wafer still shows high junction leakage. Moreover, HVt can have a low source-drain off-current leakage and LVt can have a high source-drain off-current leakage. Thus, junction leakage can be negligible for LVt but not for HVt. This can be seen as reasoning for the DSB layer for the LVt.

Figure 2:
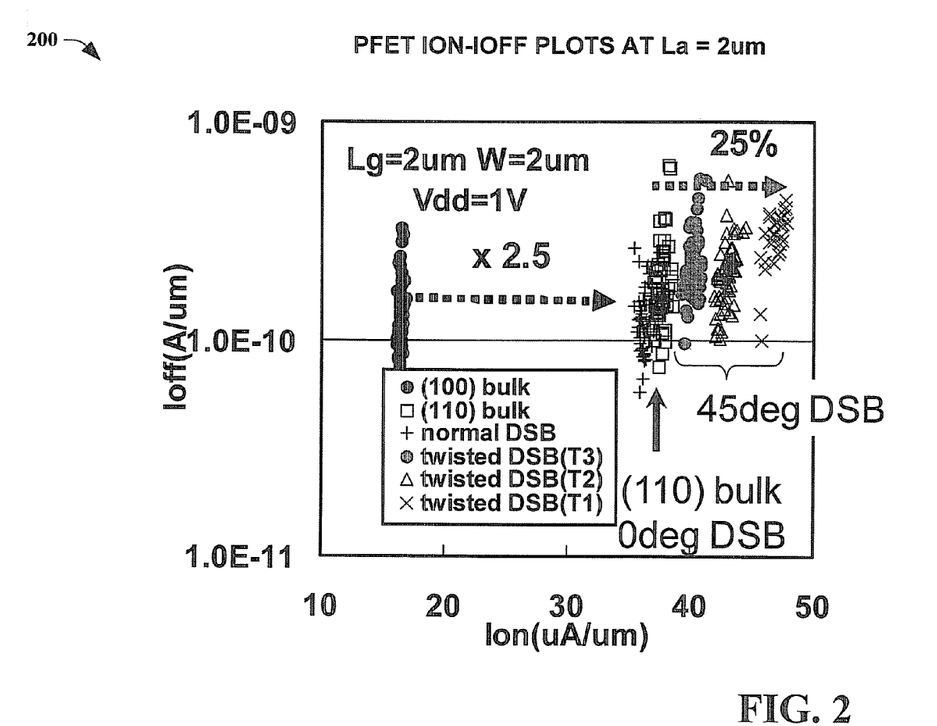
FIG. 2 is a graph illustrating plots of PFETs with varying thickness of a Direct Silicon Bonded (DSB) substrate.
Figure 3:
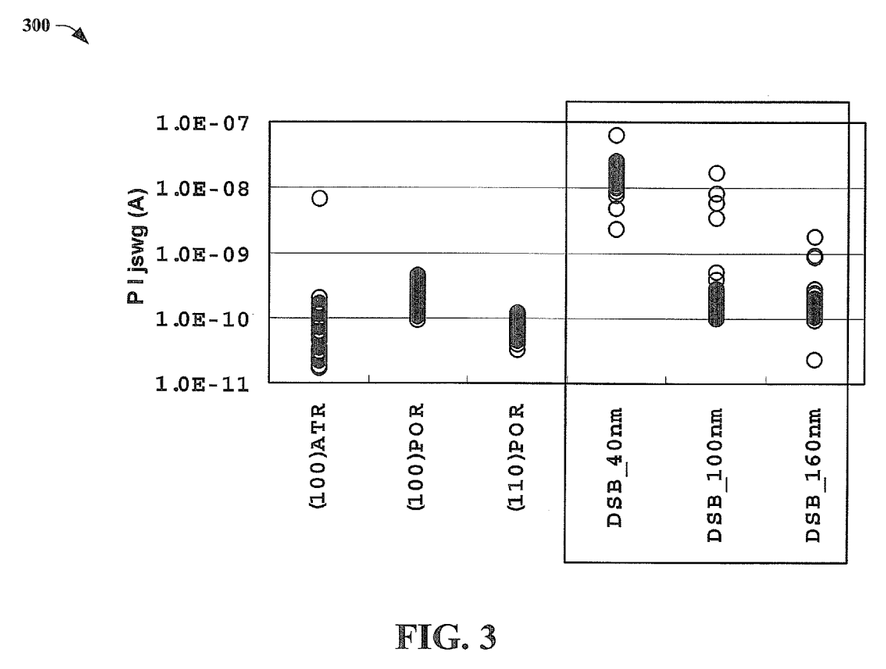
FIG. 3 is a graph illustrating the junction leakage current for varying thickness of a Direct Silicon Bonded (DSB) substrate.

FIG. 2 is a graph 200 illustrating plots of PFETs with varying thickness of a Direct Silicon Bonded (DSB) substrate. The graph 200 shows Ion-Ioff plots of PFET's with Lg=2 μm devices on (100) bulk wafer, (110) bulk wafer, 0 deg normal DSB wafer and 45 deg twisted DSB wafers with three different thickness. (110) bulk shows 2.5 times higher Ion comparing to that of (100) bulk, and normal DSB wafer shows the same Ion as that of (110) bulk. Moreover, it is found that 45 deg twisted DSB wafers show Ion enhancement over (110) bulk wafer. This enhancement also depends on the (110) layer thickness. The thinner DSB has higher/on, and the thinnest DSB(T1) shows 25%/on enhancement over (110) bulk wafer (See graph 200). Additionally, FIG. 3 illustrates a graph 300 that illustrates the amount of junction leakage current for varied thickness of a DSB substrate. For thicknesses shown in the graph 300, the amount of junction leakage current varies. In particular, the graph 300 illustrates that as a thickness of a DSB substrate is increases, the amount of junction leakage current decreases.

Figure 4:
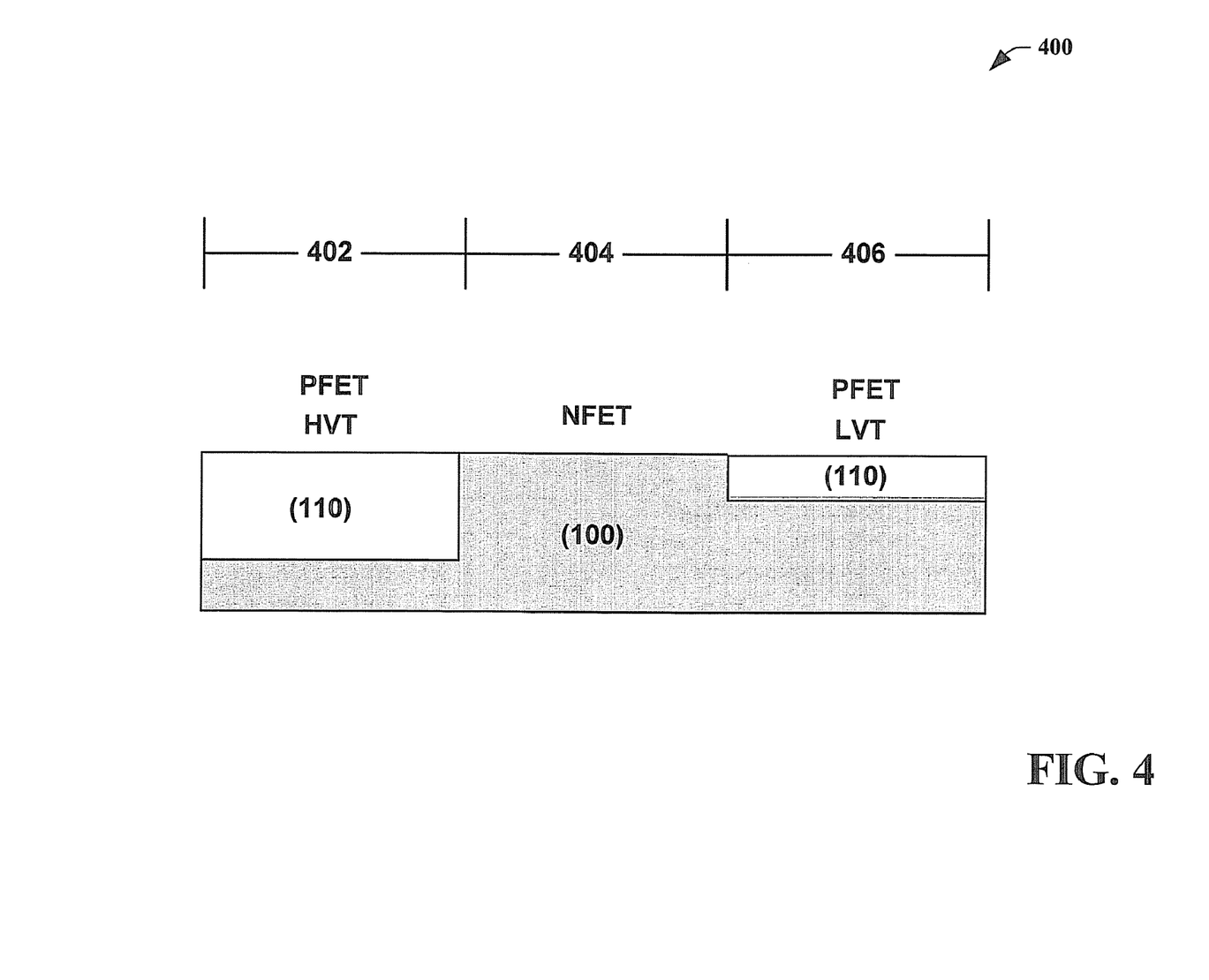
FIG. 4 is a cross-sectional view of a Direct Silicon Bonded (DSB) substrate with adjusted layer thickness based upon threshold voltage (Vt) in accordance with the subject innovation.

FIG. 4 illustrates a Direct Silicon Bonded (DSB) substrate 400 with adjusted layer thickness based upon threshold voltage (Vt) in accordance with the subject innovation. The DSB substrate 400 can include a first substrate (e.g., layer) 110 and a second substrate (e.g., layer) 100 that are directly bonded together in order to form a top layer and a bottom layer of the DSB substrate 400, wherein the top layer can be the first substrate 110 and the bottom layer can be the second substrate 100. Furthermore, the first substrate 110 can have a first plane orientation that represents a crystalline direction for a surface of the first substrate 110. Additionally, the second substrate 100 can have a second plane orientation that represents a crystalline direction for a surface of the second substrate 100, wherein the second substrate 100 is twisted to an azimuthal twist angle of 45 degrees between the first plane orientation and the second plane orientation. It is to be appreciated that the first substrate 110 or the second substrate 100 can include the azimuthal twist angle of 45 degrees. In general, the subject innovation forms or adjusts a thickness of a layer or substrate based upon a threshold voltage level in order to improve hole mobility and avoid high junction leakage.

The first substrate 110 can include a first region 402 and a second region 406. For example, the first region 402 can be a PFET region with a high threshold voltage (HVt). In another example, the second region 406 can be a PFET region with a low threshold voltage (LVt). Moreover, the first region and the second region can be separated by a region 404 included within the second substrate 100. For example, the region 404 can be an NFET region. The first region 402 can be formed with a thickness that corresponds to the HVt, wherein the HVt translates to a greater thickness. The second region 406 can be formed with a thickness that corresponds to the LVt, wherein the LVt translates to a less thickness. Thus, the thickness of the first region 402 is greater than the thickness of the second region 406. Such formation in accordance with the subject innovation enables hole mobility and avoidance of conventional high junction leakage.

Figure 5:
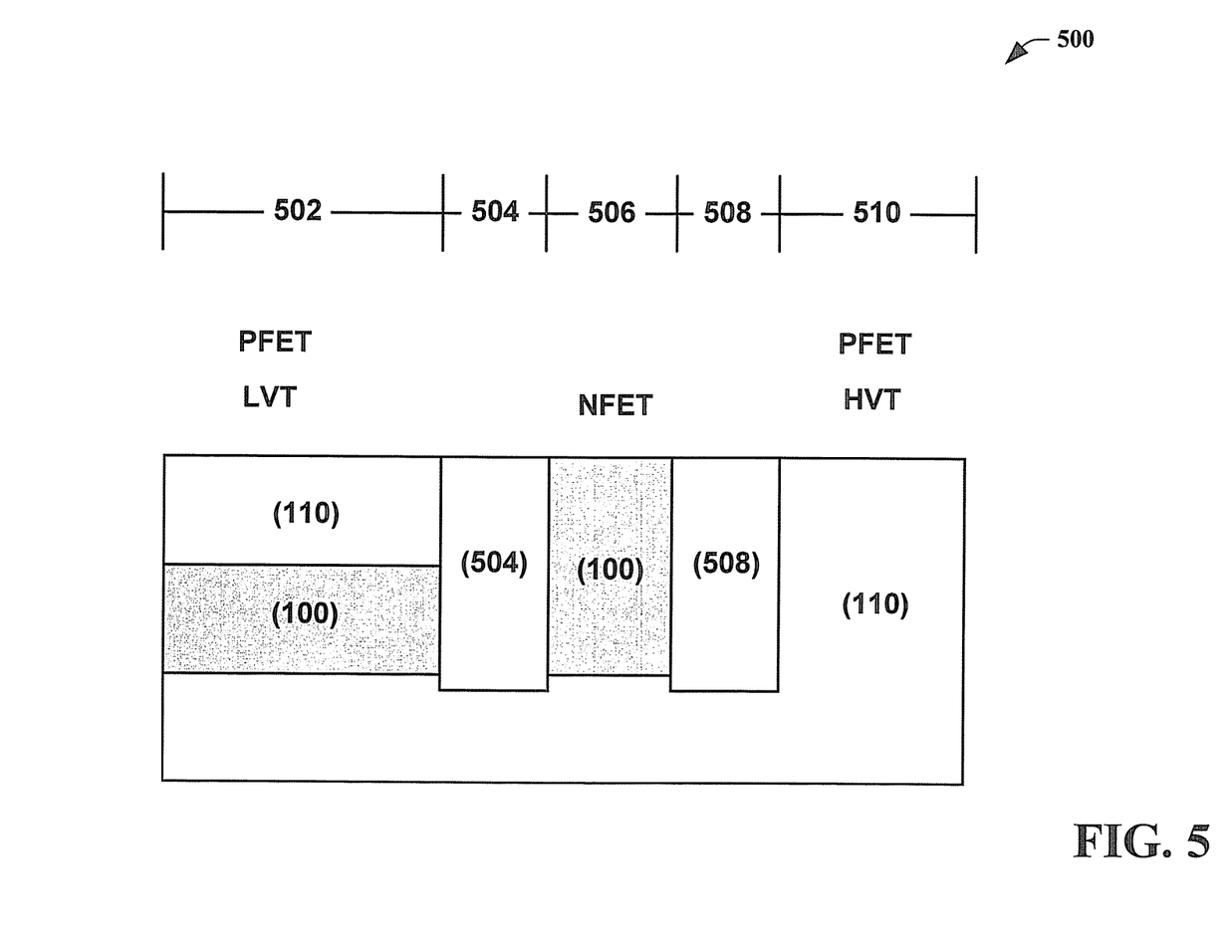
FIG. 5 is a cross-sectional view of a Direct Silicon Bonded (DSB) substrate with different thickness for layers related to threshold voltage (Vt) in accordance with the subject innovation.

FIG. 5 illustrates a Direct Silicon Bonded (DSB) substrate 500 with different thickness for layers related to threshold voltage (Vt) in accordance with the subject innovation. The DSB substrate 500 can include a first substrate (e.g., layer) 110, a second substrate (e.g., layer) 100, and a third substrate (e.g., layer) 110. The DSB substrate 500 can include the first substrate 110 directly bonded to the second substrate 100 in order to create a bottom layer and a middle layer in which the bottom layer is the first substrate 110 and the middle layer is the second substrate 100. Moreover, the third substrate 110 can be directly bonded to the second substrate to create a top layer in which the third substrate 110 is the top layer. Thus, the DSB substrate 500 can include a bottom layer (e.g., the first substrate 110), a middle layer (e.g., the second substrate 100), and a top layer (e.g., the third substrate 110).

In regards to the azimuthal twist angle, each substrate can include a corresponding plane orientation (e.g., the first substrate 110 can include a first plane orientation, the second substrate 100 can include a second plane orientation, and/or the third substrate 110 can include a third plane orientation). It is to be appreciated that any suitable substrate can include an azimuthal twist angle of 45 degrees. For example, the first substrate 110 (bottom layer) can have an azimuthal twist angle of 45 degrees compared to the second substrate 100 (e.g., middle layer) and the third substrate 110 (e.g., top layer). In still another example, the second substrate 100 (e.g., middle layer) can have an azimuthal twist angle of 45 degrees in comparison to the first substrate 110 (e.g., bottom layer) and the third substrate 110 (e.g., top layer).

The third substrate 110 can include a first region 502 having a low threshold voltage (LVt). For example, the first region 502 can be a PFET region with a LVt. The first substrate 110 can include a first region 510 having a high threshold voltage (HVt). For example, the first region 510 can be a PFET region with a HVt. The second substrate 100 can include a region 506, wherein the region 506 can be, for example, an NFET region. The DSB substrate 500 can further include a first Shallow Trench Isolation (STI) region 504 and a second STI region 508. The first STI region 504 can be between the first region 502 of the third substrate 110 and the region 506 of the second substrate 100, and the second STI region 508 can be between the region 506 of the second substrate 100 and the first region 510 of the first substrate 110.

The DSB substrate 500 can include, as described, a thickness for the first region 502 that corresponds to the LVt and a thickness for the first region 510 that corresponds to the HVt, wherein the thickness for the first region 502 is less than the thickness for the first region 510. In other words, a HVt can correspond to a greater thickness and a LVt can correspond to a less thickness. By adjusting and/or forming the DSB substrate 500 with thickness based upon Vt, the hole mobility can be improved as well as limiting high junction leakage.

Figure 6:
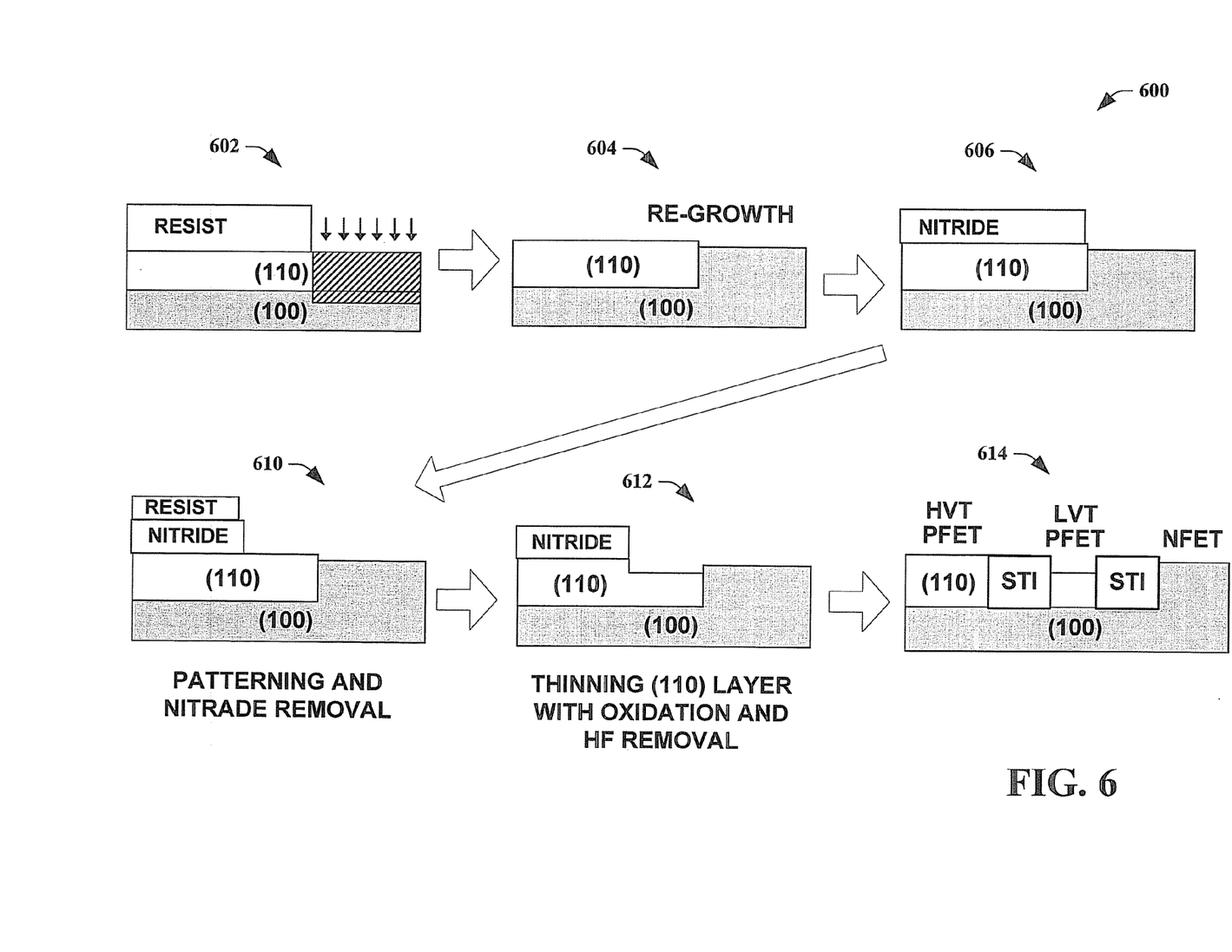
FIG. 6 is a methodology for making or manufacturing a Direct Silicon Bonded (DSB) substrate with varying layer thickness corresponding to threshold voltage (Vt).

Referring now to FIG. 6, a methodology 600 for making or manufacturing a Direct Silicon Bonded (DSB) substrate with varying layer thickness corresponding to threshold voltage (Vt) is depicted. The methodology 600 can relate to a Direct Silicon Bonded (DSB) substrate with two or more layers or substrates, wherein at least one of the layers or substrates includes an azimuthal twist angle of 45 degrees. For instance, the DSB substrate can include a first substrate (e.g., layer) 110 and a second substrate (e.g., layer) 100 in which at least one of the first substrate 110 or the second substrate 100 can have an azimuthal twist angle of about 45 degrees in comparison to one another.

At reference numeral 602, a resist can be applied to a portion of the top layer (e.g., a portion of the first substrate 110) on the DSB substrate. Further, at reference numeral 602, an etch can be performed to remove at least one of a portion of the first substrate 110 (e.g., a portion of the top layer that is does not include resist) or a portion of the second substrate 100. It is to be appreciated that the etch can remove any portion of any suitable layer within the DSB substrate that does not include resist. For example, the etching (110) Si and growth by Silicon epitaxy can be provided. The Silicon orientation of the epitaxial layer can correspond to the bottom layer's orientation. In another example, the conversion of (110) Si to (100) Sit can be provided by implanting Ge Ion beyond the depth of the bonding interface and the crystal changed to amorphous. Following this example, annealing with 600 C.-800 C. for 30 minutes to 1 hour, amorphous converts to crystal. The Silicon orientation corresponds to the bottom layer. If the top is Si (11) and the bottom is Si (100), and amorphized by Ge Ion implantation, the top layer is changed to Si (100). In general, it is to be appreciated that the etch can be used as well as a Ge Ion implantation technique. At reference numeral 604, the resist can be removed and a re-growth can be performed on the DSB substrate in order to re-grow a portion of the second substrate (e.g., bottom layer) 100.

At reference numeral 606, Nitride (e.g., a Nitride layer) can be applied to a portion of the top layer (e.g., the second substrate 110). At reference numeral 608, resist can be applied to a portion of the Nitride. Moreover, at reference numeral 610, patterning and Nitride removal can be performed. At reference numeral 612, the second substrate (e.g., top layer) 110 can be thinned with oxidation and/or HF removal. Additionally, at reference numeral 612, the Nitride can be removed. Continuing at reference numeral 614, at least one Shallow Trench Isolation (STI) can be formed within the DSB substrate. In particular, the methodology 600 can form the DSB substrate with a first region within the second substrate 110, a second region and a third region within the first substrate 100. The first region can be a PFET that is HVt, the second region can be a PFET that is LVt, and the third region can be an NFET. Moreover, it is to be appreciated that an STI can be formed in between the first region and the second region. Still further, an STI can be formed in between the second region and the third region. It is to be appreciated that the methodology 600 can create the first region with a thickness related to the threshold voltage (Vt) in which a HVt corresponds to a thickness that is greater than a thickness for the third region having a LVt. In other words, the thickness for a substrate with a HVt can be greater than the thickness for a substrate with a LVt.

Figure 7:
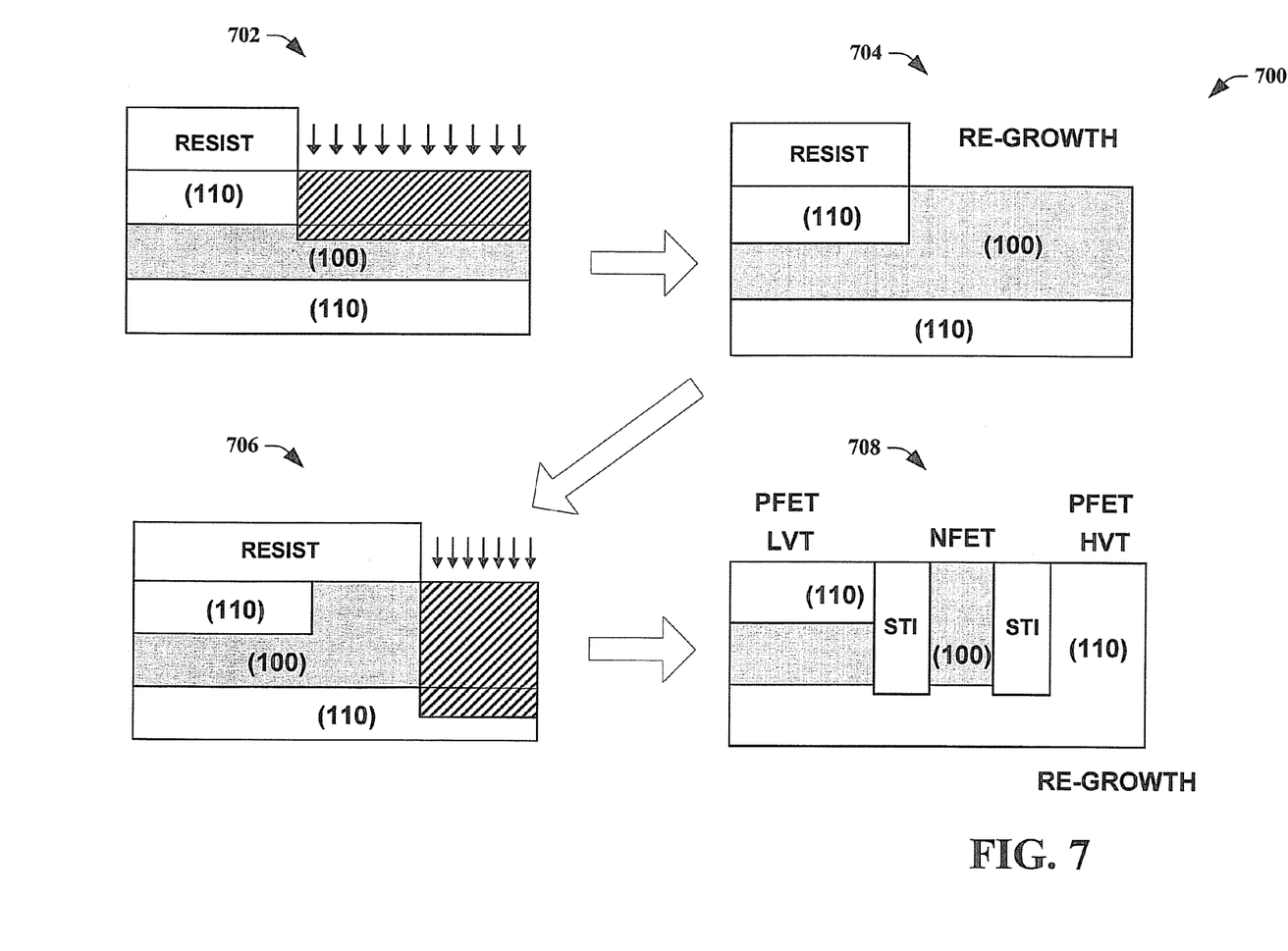
FIG. 7 is a methodology for making or manufacturing a Direct Silicon Bonded (DSB) substrate with adjusted layer thickness that correlates to threshold voltage (Vt).

FIG. 7 illustrates a methodology 700 for making or manufacturing a Direct Silicon Bonded (DSB) substrate with adjusted layer thickness that correlates to threshold voltage (Vt). The methodology 700 can relate to a Direct Silicon Bonded (DSB) substrate with two or more layers or substrates, wherein at least one of the layers or substrates includes an azimuthal twist angle of 45 degrees. For instance, the DSB substrate can include a first substrate (e.g., layer) 110 and a second substrate (e.g., layer) 100 in which at least one of the first substrate 110, the second substrate 100, or the third substrate 110 can have an azimuthal twist angle of about 45 degrees in comparison to one another. In particular, the first substrate 110 can be a bottom layer, the second substrate 100 can be a middle layer, and the third substrate 110 can be a top layer.

At reference numeral 702, resist can be applied to a portion of the top layer (e.g., the third substrate 110) in which an etch technique can be performed in order to remove at least one of a portion of the top layer (e.g., a portion of the third substrate 110 that does not include resist) or a portion of the middle layer (e.g., a portion of the second substrate 100). It is to be appreciated that the etch can remove any portion of any suitable layer within the DSB substrate that does not include resist. For example, the etching (110) Si and growth by Silicon epitaxy can be provided. The Silicon orientation of the epitaxial layer can correspond to the bottom layer's orientation. In another example, the conversion of (110) Si to (100) Sit can be provided by implanting Ge Ion beyond the depth of the bonding interface and the crystal changed to amorphous. Following this example, annealing with 600 C.-800 C. for 30 minutes to 1 hour, amorphous converts to crystal. The Silicon orientation corresponds to the bottom layer. If the top is Si (11) and the bottom is Si (100), and amorphized by Ge Ion implantation, the top layer is changed to Si (100). In particular, Ge Ion can be implanted between the second layer and the third layer at 702. In general, it is to be appreciated that the etch can be used as well as a Ge Ion implantation technique. At reference numeral 704, a re-growth technique can be implemented in order to re-grow a portion of the middle layer (e.g., the second substrate 100).

At reference numeral 706, resist can be applied to a portion of the middle layer (e.g., the second substrate 100) that has been re-grown. Further, at reference numeral 706, an etch technique (e.g., wet, dry, etc.) can be performed in order to remove at least one of a portion of the middle layer (e.g., the second substrate 100) or a portion of the bottom layer (e.g., the first substrate 110). It is to be appreciated that at 706, Ge Ion implantation can be performed in which Ge can be implanted to the depth bonded interface between the second layer and the third layer. At reference numeral 708, resist can be removed and a re-growth technique can be performed in order to re-grow a portion of the bottom layer (e.g., the first substrate 110).

Continuing with reference numeral 708, at least one Shallow Trench Isolation (STI) can be formed within the DSB substrate. In general, the methodology 700 can form the DSB substrate with a first region within the third substrate 100, a second region within the second substrate 100, and a third region within the first substrate 110. The first region can be a PFET region that is LVt, the second region can be an NFET region, and the third region can be a PFET region that is HVt. It is to be appreciated that the methodology 700 can create the first region with a thickness related to the threshold voltage (Vt) in which a LVt corresponds to a thickness that is less than a thickness for the third region having a HVt. In other words, the thickness for a substrate with a HVt can be greater than the thickness for a substrate with a LVt. Moreover, it is to be appreciated that an STI can be formed in between the first region and the second region as well as the second region and the third region.

With respect to any figure or numerical range for a given characteristic, a figure or a parameter from one range may be combined with another figure or a parameter from a different range for the same characteristic to generate a numerical range.

While the invention has been explained in relation to certain aspects, it is to be understood that various modifications thereof will become apparent to those skilled in the art upon reading the specification. Therefore, it is to be understood that the innovation disclosed herein is intended to cover such modifications as fall within the scope of the appended claims.

What is claimed is:

1. A semiconductor device, comprising:
a direct Silicon bonded substrate comprising:
a first substrate directly bonded to a second substrate utilizing a direct bonded Silicon technique to create a top layer and a bottom layer in which the top layer is the first substrate and the bottom layer is the second substrate;
the first substrate having a first plane orientation that represents a crystalline direction for a surface of the first substrate;
the second substrate having a second plane orientation that represents a crystalline direction for a surface of the second substrate, wherein the second substrate is twisted to an azimuthal twist angle of 45 degrees between the first plane orientation and the second plane orientation;
the first substrate includes:
a first region with a high threshold voltage (HVt) having a first thickness; and
a second region with a low threshold voltage (LVt) having a second thickness, wherein the first thickness is greater than the second thickness;
wherein an influence of a leakage current is negligible in the second region due to a high source-drain off current leakage and an influence of the leakage current is not negligible in the first region due to a low source-drain off current leakage; and
the second substrate includes a region between the first region and the second region.

2. The semiconductor device according to claim 1, wherein the first region is a PFET region and the second region is a PFET region.

3. The semiconductor device according to claim 1, wherein the region included with the second substrate is a NFET region.

* * * * *